(12) United States Patent
Beffa

(10) Patent No.: US 8,112,059 B2
(45) Date of Patent: Feb. 7, 2012

(54) MIXER CIRCUIT, INTEGRATED CIRCUIT DEVICE AND RADIO FREQUENCY COMMUNICATION UNIT

(75) Inventor: Federico Alessandro Fabrizio Beffa, Agno (CH)

(73) Assignee: MediaTek Singapore Pte. Ltd., Singapore (SG)

( * ) Notice: Subject to any disclaimer, the term of this patent is extended or adjusted under 35 U.S.C. 154(b) by 324 days.

(21) Appl. No.: 12/607,048

(22) Filed: Oct. 27, 2009

(65) Prior Publication Data

US 2011/0065412 A1 Mar. 17, 2011

Related U.S. Application Data

(66) Substitute for application No. 61/242,856, filed on Sep. 16, 2009.

(51) Int. Cl.
*H04B 1/26* (2006.01)

(52) U.S. Cl. .......................................... 455/326; 455/333

(58) Field of Classification Search ............... 455/150.1, 455/313, 317, 318, 323, 325, 326, 327, 330, 455/333, 334; 327/355, 357, 358, 359
See application file for complete search history.

(56) References Cited

U.S. PATENT DOCUMENTS

| | | | |
|---|---|---|---|
| 3,195,073 A | 7/1965 | Penn | |
| 6,944,437 B2 * | 9/2005 | Yang et al. | 455/323 |
| 7,050,779 B2 * | 5/2006 | Ono et al. | 455/333 |
| 7,852,135 B2 * | 12/2010 | Laaser | 327/355 |
| 2004/0147240 A1 | 7/2004 | Igarashi | |
| 2009/0111377 A1 | 4/2009 | Mitomo | |
| 2011/0230151 A1 * | 9/2011 | Tsai et al. | 455/150.1 |

FOREIGN PATENT DOCUMENTS

| | | |
|---|---|---|
| JP | 2003198329 A | 7/2003 |
| WO | 2009003095 A1 | 12/2008 |
| WO | 2009003095 A9 | 12/2008 |

OTHER PUBLICATIONS

International application No. PCT/EP2010/004633, International filed: Jul. 28, 2010, International Searching Report mailing date: Dec. 22, 2010.

(Continued)

*Primary Examiner* — Thanh Le
(74) *Attorney, Agent, or Firm* — Winston Hsu; Scott Margo

(57) ABSTRACT

A mixer circuit comprises an input stage arranged to convert an input voltage signal received at an input of the mixer circuit into at least one current signal, and a frequency conversion stage comprising at least one switching element arranged to convert a signal component of the at least one current signal from an input frequency to a output frequency. The input stage comprises at least one resistance connected between the input of the mixer circuit and the at least one switching element. The at least one switching element and the at least one resistance are arranged such that the at least one switching element comprises a 'turn-on' resistance that exhibits a resistivity that is a factor less than the at least one resistance connected thereto.

20 Claims, 11 Drawing Sheets

OTHER PUBLICATIONS

Sowlati, "Single-Chip Multiband WCDMA/HSDPA/EGPRS Transceiver with Diversity Receiver and 3G DigRF Interface Without SAW Filters in Transmitter / 13G Receiver Paths," ISSCC 2009/Session 6/Cellular and Tuner/6.3, Feb. 2, 2009.

Mirzaei, "A Frequency Translation Technique for SAW-Less 3G Receivers," 2009 Symposium on VLSI Circuits Digest of Technical Papers, 2009.

Pullela, "An Integrated Closed-Loop Polar Transmitter with Saturation Prevention and Low-IF Receiver for Quad-Band GPRS/EDGE," ISSCC 2009, Session 6, Cellular and Tuner, 6.1, Feb. 9, 2009.

Tenbroek, "Single-Chip Tri-Band WCDMA/HSDPA Transceiver without External SAW Filters and with Integrated TX Power Control," ISSCC 2008/ Session 10/ Cellular Transceivers/ 102, Feb. 5, 2008.

* cited by examiner

MIXER CIRCUIT, INTEGRATED CIRCUIT DEVICE AND RADIO FREQUENCY COMMUNICATION UNIT

FIELD OF THE INVENTION

The field of this invention relates to a mixer circuit, an integrated circuit device and a radio frequency communication unit comprising such a mixer circuit and/or integrated circuit. The invention is particularly applicable to, but not limited to, an integrated, linear, inductor-less mixer circuit.

BACKGROUND OF THE INVENTION

In the field of radio frequency (RF) communication receivers, the main task of the receiver front-end circuit is to process a signal that is received by an antenna coupled to the receiver front-end circuit in such a manner that it can be more easily processed by subsequent receiver circuits, for example, demodulation circuitry. Typically, such front-end circuits comprise low noise amplifier (LNA) circuitry for amplifying the received RF signal, and mixer circuit arranged to perform frequency translation of the amplified radio frequency signal to a lower intermediate or baseband frequency. The intermediate/baseband frequency signal may then be filtered to remove interfering signals etc.

Since the frequency of the intermediate or baseband signal output by the mixer circuit is typically much lower than the carrier frequency ($f_{RF}$) for the received RF signal, all stages within the receive chain, subsequent to the mixer circuit, operate at low or baseband frequencies. Furthermore, due to the amplification provided by the LNA circuitry in front of the mixer circuit, and by the mixer circuit itself (if active mixers are used), the signal levels following the mixer circuit are also larger than the signal level of the received RF signal. Accordingly, these low frequency/high signal level characteristics allow the use of a large variety of circuit techniques for the implementation of the stages within the receive chain following the front-end circuitry.

However, due to the high operating frequencies and the low signal levels of the received RF signal, only a very limited number of circuit techniques may be used to successfully implement the front-end circuitry that comprises the LNA circuitry and the mixer circuit. The amplification provided by the LNA increases the signal level at the input of the mixer circuit/device and, therefore, alleviates its noise requirements. However, fully integrated LNAs are known to exhibit poor selectivity. As a consequence, the LNA not only amplifies the wanted signal component, but also amplifies unwanted signal components with frequencies close to the frequency of the wanted signal component. Accordingly, the higher the LNA gain, the more challenging become the linearity requirements for the mixer circuit. A key mixer circuit linearity metric is the IP3 (third order intercept point), since the mixer is often the bottleneck within, say, a receiver front end in terms of IP3, as well as IP2 (second order intercept point).

Referring now to FIG. 1, there is illustrated an example of a known mixer circuit topology in the form of a Gilbert quadrature mixer 100 comprising a pair of Gilbert cell mixers 110, 120. The input stage for each Gilbert cell mixer comprises a respective transconductance stage 115, 125, which transforms the input signal coming from, for example, a preceding LNA or filter into a signal current. This signal current is then chopped by a group of four transistors 130, which down-converts the frequency of the signal current to the desired intermediate or baseband frequency. The output of the mixer 100 is in the form of a current and is typically converted to a voltage by a resistor/capacitor RC load (not shown), which also functions as a low-pass filter.

Two significant limitations of this known mixer design are firstly that the linearity of the mixer is primarily limited by the input transconductance stages 115, 125, and secondly that flicker noise generated by the transistors 130 appears at the output. For the first of these limitations, good mixer designs with a current consumption commensurate to portable devices, such as mobile telephone handsets, etc., require an input-referred IP3 value smaller than circa 0 dBV. Such a stringent requirement is not achievable with the use of such an input transconductance stage. As for the second of the above identified limitations, such a limitation is usually not significant for bipolar transistor implementations, since flicker noise is significantly less for bipolar transistors than it is for, say, MOSFETs (metal oxide semiconductor field effect transistors). However, the presence of flicker noise at the output is a significant problem for CMOS implementations.

Whilst bipolar transistors may be more suitable for implementing mixer circuits in terms of their flicker noise, the fabrication of high performance bipolar transistors requires expensive processing steps during their fabrication. Consequently, the fabrication of such high performance bipolar transistors is prohibitively expensive for cost sensitive implementations, such as within front end circuits of RF communication receivers. Less expensive CMOS processes may be used to produce lower performance bipolar transistors. However, such lower performance bipolar transistors are not capable of operating at the Gigahertz frequencies required by modern RF communication receivers.

A known method for overcoming the flicker noise problem of CMOS implementations of the Gilbert cell mixer is by way of suppressing the DC (direct current) current flowing in the switching transistors, since the flicker noise of CMOS transistors, such as metal oxide semiconductor field effect transistors (MOSFETs), is proportional to the drain bias current flowing in the transistor. FIG. 2 illustrates a known example of a passive Gilbert type mixer 200 whereby coupling capacitors 260 are connected in series with the switching transistors 230 the output ports of the mixer are terminated by transimpedance amplifiers 240, 250, which also function as low-pass filters. In this manner, the coupling capacitors 260 ensure a zero DC bias current flowing in the switching transistors 230, thereby significantly reducing the flicker noise present at the output ports of the mixer. The transimpedance amplifiers are used to hold the source/drain potential of the switching transistors at a known potential. However, since such a mixer design still comprises input transconductance stages 210, 220, the problem of odd-order distortion, and thus poor linearity, is still present.

FIG. 3 illustrates a further example of a known mixer circuit 300 implementing an alternative method for overcoming the flicker-noise problem of the classic Gilbert cell mixer design illustrated in FIG. 1. The mixer circuit 300 of FIG. 3 comprises an active 2LO-LO mixer whereby switches 340 are directly connected to the transconductance stages 310, and are toggled at twice the desired local oscillator frequency (LO) used for output transistors 330. In this manner, the flicker noise of the output transistors 330 does not appear at the output of the mixer circuit. Conversely, the flicker noise of the switches 340 does appear at the output, but as common mode noise, which may be suppressed. However, once again the mixer circuit 300 still comprises input transconductance stage 310, and thus the problem of odd-order distortion, and thus poor linearity, is still present.

FIG. 4 illustrates an example of a further known mixer circuit 400. For each of the known mixer circuits illustrated in FIGS. 1 to 3, the odd-order distortion, and in particular the third order intercept point (IP3) is primarily limited by the input transconductance stages. For the mixer circuit 400 of FIG. 4, there is no input transconductance stage. Instead, capacitors 410 are used to connect the switching transistors directly to an inductor-capacitor (LC) tank 420 used as a load for, say, a preceding LNA. Importantly, the capacitors 410 are constituent parts of the tank 420, and not merely coupling capacitors. In this manner, their impedance and magnitude are relatively significant and will provide some isolation between the respective quadrature I-channel and the Q-channel. The isolation is required in order to keep the noise contribution of transimpedance amplifiers 440 low. In addition, the parallel resonance boosts the signal current coming from the LNA by a factor equal to the quality factor of the LC tank 420. Since the input stage of the mixer circuit 400 comprises only passive components, the linearity of this mixer circuit 400 is superior, as compared to those of FIGS. 1 to 3, since the linearity is only limited by the switching transistors 430 and by the transimpedance amplifiers 440.

A problem with the mixer circuit 400 of FIG. 4 is that the LC tank 420 requires the inclusion of an inductor. Analogue circuits comprising components such as inductors do not scale with improvements in semiconductor manufacturing processes in the same manner as digital circuits. Thus, the presence of analogue components, such as inductors, is a considerable burden on the ability to scale a circuit in order to reduce the size, footprint, etc. of an integrated circuit device.

SUMMARY OF THE INVENTION

Accordingly, the invention seeks to mitigate, alleviate or eliminate one or more of the above mentioned disadvantages singly or in any combination. Aspects of the invention provide an amplifier circuit, an integrated circuit device and a radio frequency communication device, comprising such an amplifier circuit, as described in the appended claims.

According to a first aspect of the invention, there is provided a mixer circuit comprising an input stage arranged to convert an input voltage signal received at an input of the mixer circuit into at least one current signal, and a frequency conversion stage arranged to convert a signal component of the at least one current signal from an input frequency to an output frequency. The input stage comprises at least one resistance connected between the input of the mixer circuit and at least one switching element of the frequency conversion stage. The at least one switching element of the frequency conversion stage and the at least one resistance are arranged such that the at least one switching element comprises a 'turn-on' resistance that exhibits a resistivity that is at least a factor less than the at least one resistance connected thereto.

In this manner, a mixer circuit arrangement adapted in accordance with examples of the invention enables the implementation of an inductor-less mixer circuit with good linear characteristics, as well as well-defined impedances at the interfaces with adjacent circuits, such as a preceding LNA circuit, etc. As a result, the integration of such a mixer circuit into an integrated circuit device as part of a larger on-chip system, such as an integrated on-chip RF receiver front-end, may be achieved without inductors, and the like, impacting on the scalability of the system. Furthermore, the fact that no active input transconductance stage is required means that the power usually dissipated within the transconductance stage of prior art mixer circuits may be reallocated to other sub-blocks within the system, such as a preceding LNA or a baseband transimpedance amplifier in the case of a RF receiver front-end system. Accordingly, smaller, lower power and more linear integrated systems comprising such mixer circuits are achievable.

According to an optional feature of the invention, the input stage may be arranged to receive a differential input voltage signal at the input of the mixer circuit and to convert the received differential input voltage signal into at least one differential current signal. Furthermore, the frequency conversion stage may comprise at least one frequency conversion circuit comprising two pairs of cross-coupled switching elements, at least one frequency conversion circuit being arranged to receive the at least one differential current signal from the input stage and to convert a signal component of the at least one differential current signal from the input frequency to an output frequency. In this manner, the mixer circuit may comprise a differential mixer circuit.

According to an optional feature of the invention, the at least one resistance of the input stage may comprise an RC (resistance/capacitance) network arranged to provide a transmission zero at an odd harmonic of the switching frequency of the frequency conversion stage switching elements. For example, the RC network may comprise a Twin-T RC network circuit. According to a further optional feature of the invention, the at least one resistance of the input stage may comprise a plurality of cascaded RC networks arranged to provide transmission zeros at a plurality of odd harmonics of the switching frequency of the frequency conversion stage switching elements. In this manner, unwanted signal components within the received input signal located at the odd harmonics of the switching frequency will be substantially blocked by the transmission zero.

According to an optional feature of the invention, the input stage may further comprise at least one coupling capacitance connected in series with the at least one resistance. In this manner, the coupling capacitance(s) enable(s) greater flexibility in setting the operating voltages of the mixer circuit, as well as for a preceding system sub-block such as, for example, an LNA circuit.

According to an optional feature of the invention, the frequency conversion stage may comprise at least one Gilbert cell mixer circuit.

According to an optional feature of the invention, the frequency conversion stage may comprise an in-phase (I) frequency conversion circuit and a quadrature (Q) frequency conversion circuit. Furthermore, the input stage may be arranged to receive a differential input voltage signal received at the input of the mixer circuit and to convert the received differential input voltage signal into a first differential current signal for the in-phase (I) frequency conversion circuit and a second differential current signal for the quadrature (Q) frequency conversion circuit.

According to an optional feature of the invention, the mixer circuit may comprise a plurality of inputs for receiving input voltage signals from a plurality of signal channels, each input being operably coupled to an input stage for converting the input voltage signal received at the respective input into a current signal. A frequency conversion stage may be arranged to convert a signal component of the respective current signal from an input frequency to an output frequency. The mixer circuit may be further arranged to recombine the multiple signal channels at a transimpedance virtual ground at outputs of the frequency conversion stages. In this manner, the physical interconnection between, say, preceding LNA circuits and their respective mixer circuitry inputs may be kept short, thereby creating very small parasitic capacitances and, thus, reduced risk of noise pick up. As a result, such an arrangement is significantly more conducive to an inductor-less receiver design than the conventional method of recombining the channels. By recombining the channels at the transimpedance virtual ground at the output of frequency conversion stages, the signals being recombined comprise the lower intermediate or baseband frequency. As such, these signals can be routed over longer distances with less risk of performance degradation.

According to an optional feature of the invention, the input stage may comprise at least one intermediate switching element connected between the at least one resistance of the input stage and the at least one switching element of the frequency conversion stage. The at least one intermediate switching element may be arranged to toggle at a frequency at least twice that of the at least one switching element of the frequency conversion stage. In this manner, the flicker noise of the frequency conversion stage switching elements appearing at the output of the mixer circuit may be reduced.

According to an optional feature of the invention, the mixer circuit forms part of a broadband radio frequency front-end circuit.

According to a second aspect of the invention, there is provided an integrated circuit device comprising a mixer circuit. The mixer circuit comprises an input stage arranged to convert an input voltage signal received at an input of the mixer circuit into at least one current signal. A frequency conversion stage is arranged to convert a signal component of the at least one current signal from an input frequency to an output frequency. The input stage comprises at least one resistance connected between the input of the mixer circuit and at least one switching element of the frequency conversion stage. The at least one switching element of the frequency conversion stage and the at least one resistance are arranged such that the at least one switching element comprises a 'turn-on' resistance that exhibits a resistivity that is at least a factor less than the at least one resistance connected thereto.

According to a third aspect of the invention there is provided a radio frequency communication unit comprising a mixer circuit comprising an input stage arranged to convert an input voltage signal received at an input of the mixer circuit into at least one current signal, and a frequency conversion stage arranged to convert a signal component of the at least one current signal from an input frequency to an output frequency. The input stage comprises at least one resistance connected between the input of the mixer circuit and at least one switching element of the frequency conversion stage. The at least one switching element of the frequency conversion stage and the at least one resistance are arranged such that the at least one switching element comprises a 'turn-on' resistance that exhibits a resistivity that is at least a factor less than the at least one resistance connected thereto.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Examples of the invention will be described in terms of a radio frequency (RF) communication receiver front-end mixer circuit. However, it will be appreciated by a skilled artisan that the inventive concept herein described may be embodied in any type of mixer circuit. In a number of applications, a mixer circuit adapted in accordance with the hereinafter described examples may effectively perform frequency translation of a received signal, without distortion that would typically be introduced by, say, a transconductance input stage, and without the need for on-chip inductor coils or the like. In this manner, such a mixer circuit may comprise improved scalability, and may provide lower and well defined impedances at interfaces between itself and other integrated on-chip sub-blocks, such as a preceding low noise amplifier sub-block.

Figure 1:
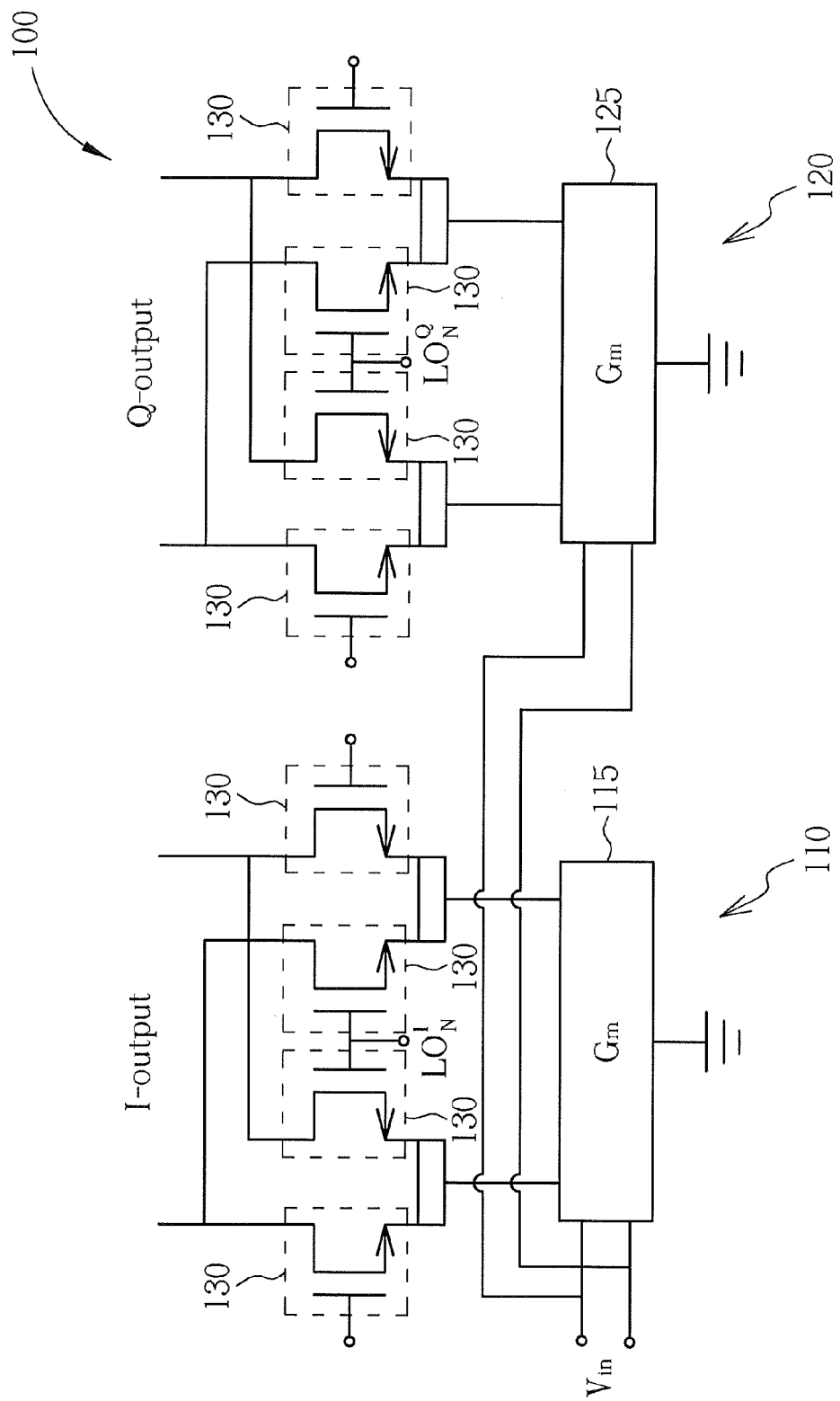
FIG. 1 illustrates an example of a known mixer circuit topology.
Figure 2:
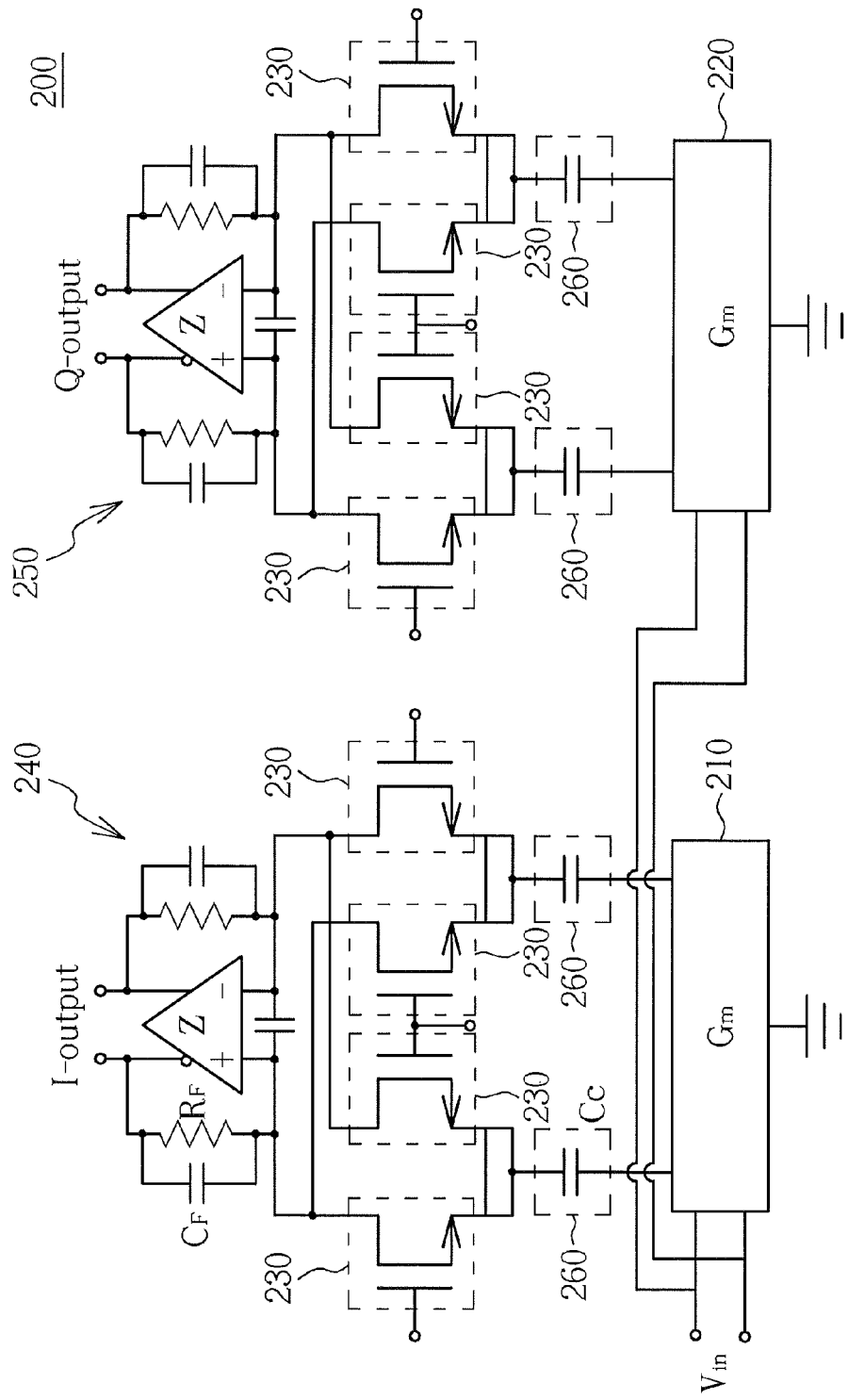
FIG. 2 illustrates an example of a passive Gilbert type mixer.
Figure 3:
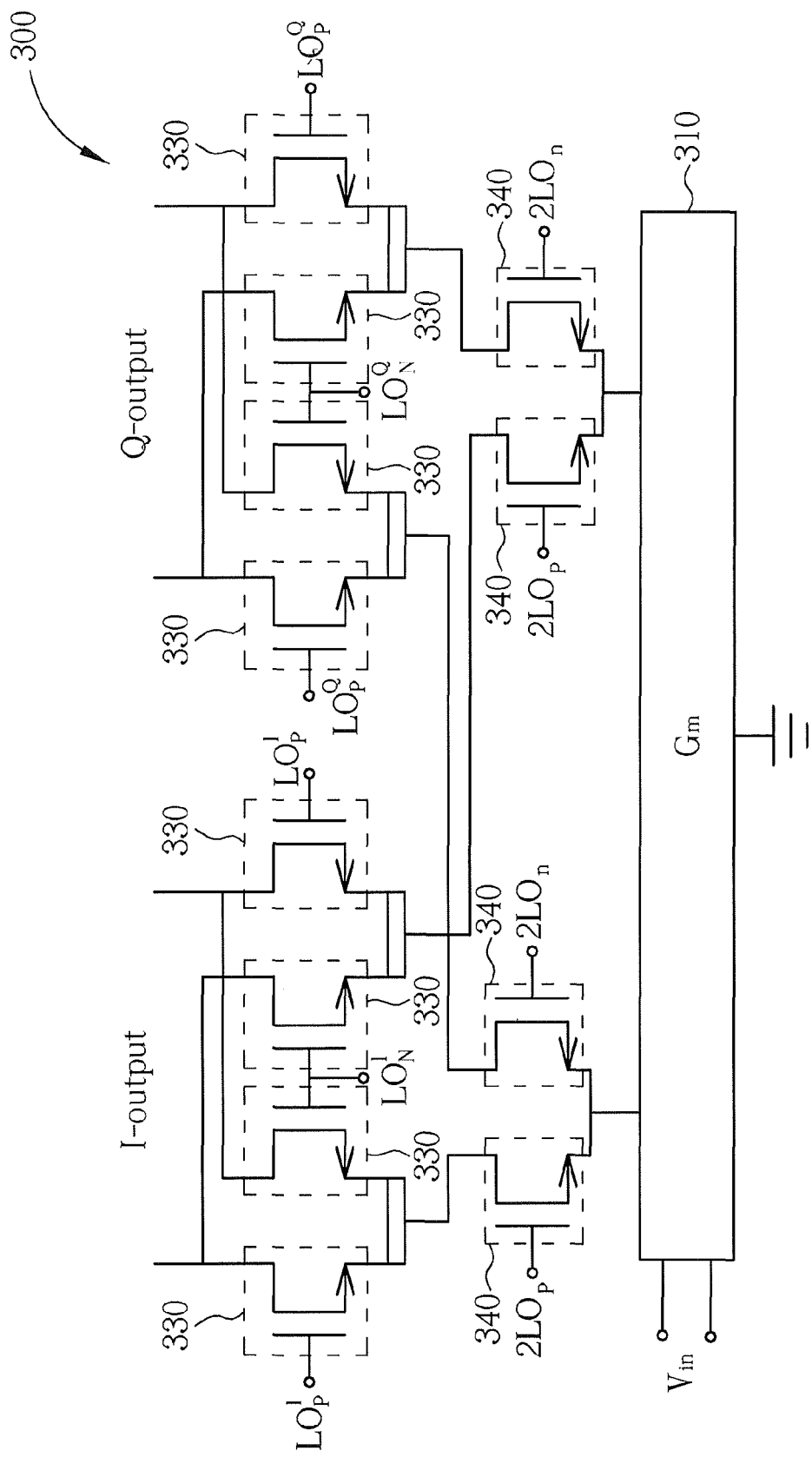
FIG. 3 illustrates a further example of a known mixer circuit topology.
Figure 4:
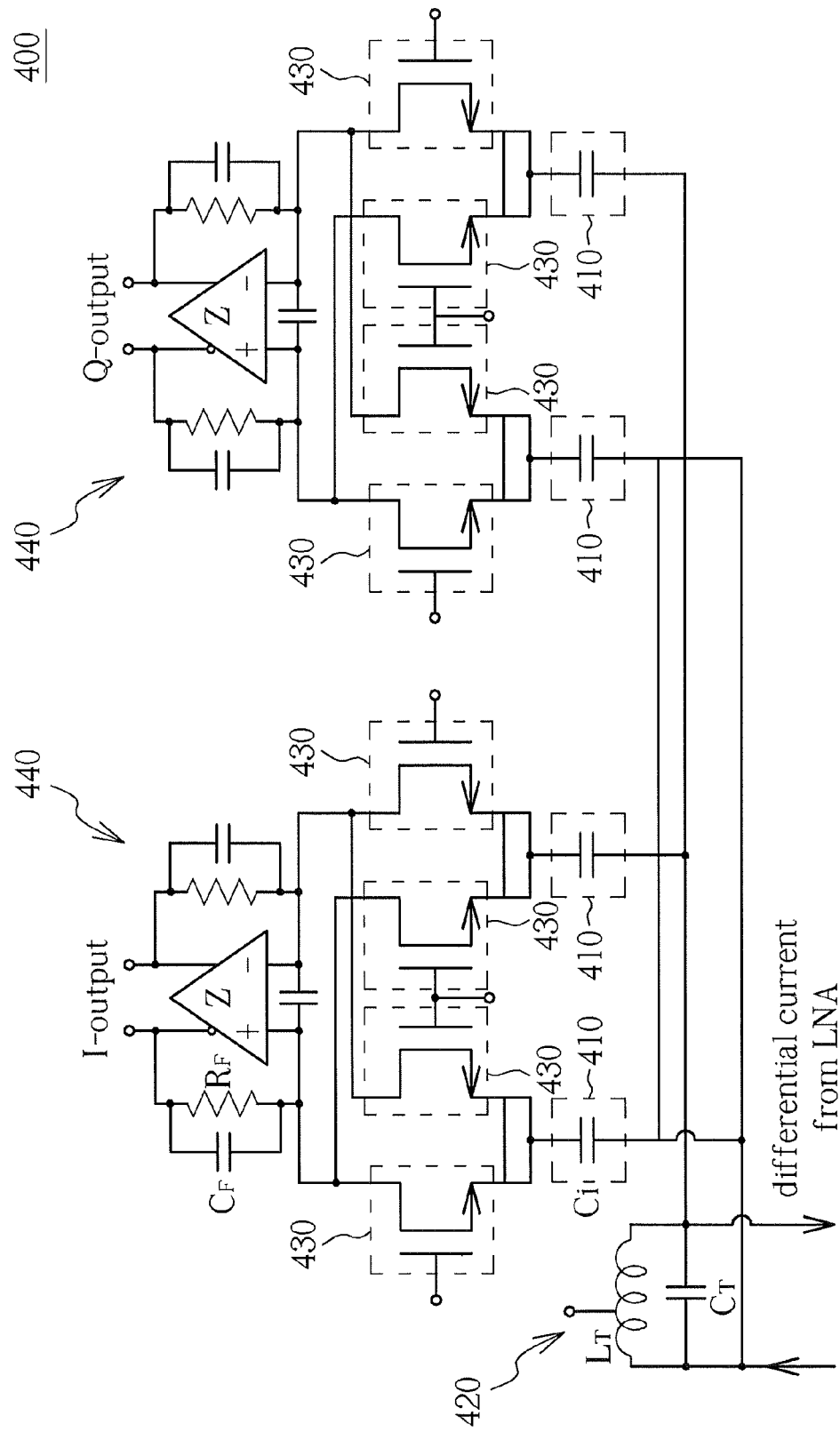
FIG. 4 illustrates a still further example of a known mixer circuit topology.
Figure 5:
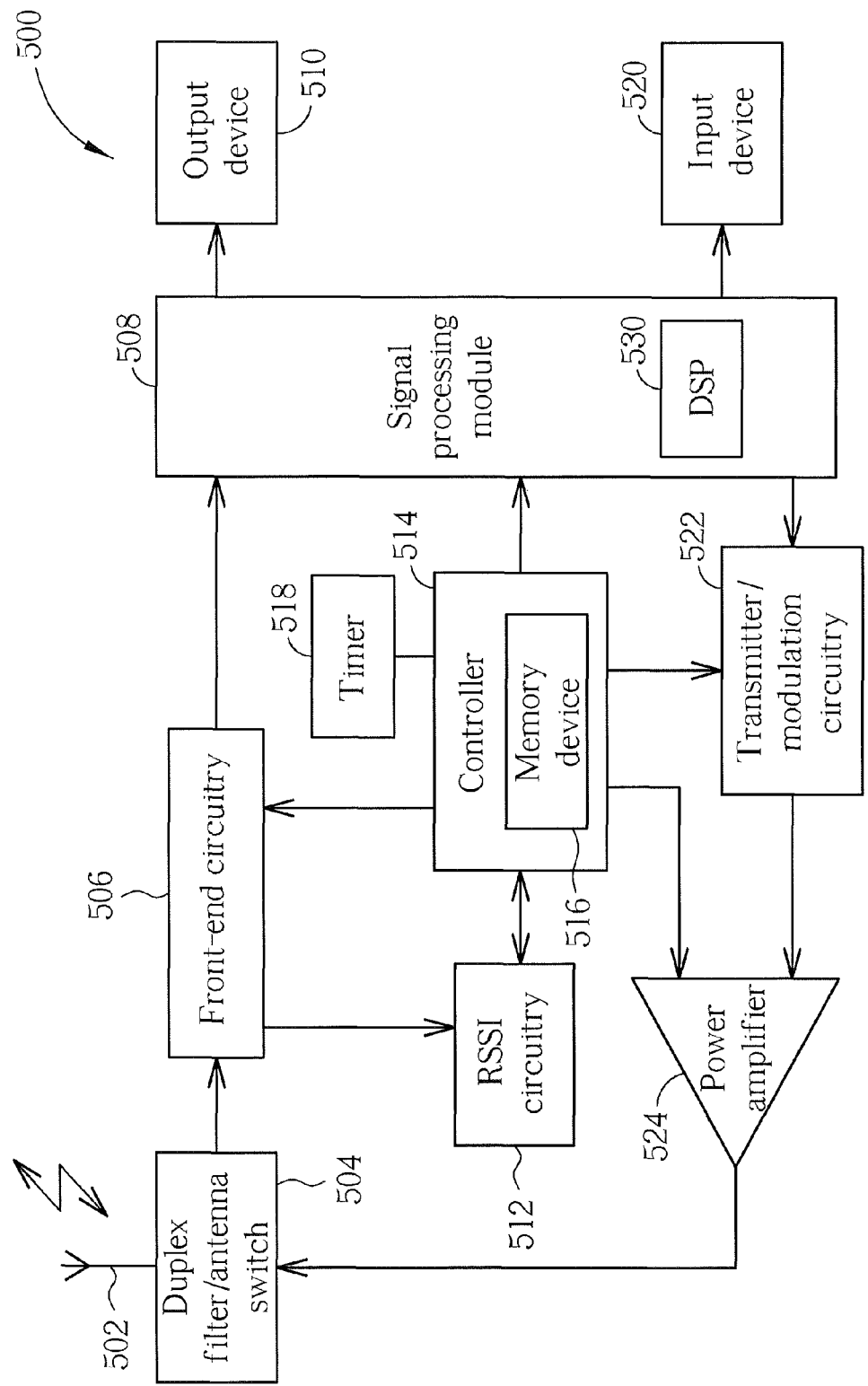
FIG. 5 illustrates a block diagram of an example of a radio frequency communication unit.

Referring first to FIG. 5, a block diagram of an example of a radio frequency (RF) communication unit (sometimes referred to as a mobile subscriber unit (MS) in the context of cellular communications or a user equipment (UE) in terms of a $3^{rd}$ generation partnership project (3GPP) communication system) is shown. The RF communication unit 500 contains an antenna 502 preferably coupled to a duplex filter or antenna switch 504 that provides isolation between receive and transmit chains within the RF communication unit 500.

The receiver chain includes receiver front-end circuitry 506 which comprises a band-pass filter, a low noise amplifier (LNA) and a mixer circuit as hereinafter described in the example arranged to effectively provide reception, filtering and intermediate or base-band frequency conversion. The front-end circuitry 506 is serially coupled to a signal processing module 508. An output from the signal processing module 508 is provided to a suitable output device 510, such as a screen or flat panel display. The receiver chain also includes received signal strength indicator (RSSI) circuitry 512, which in turn is coupled to a controller 514 that maintains overall subscriber unit control. The controller 514 may therefore receive bit error rate (BER) or frame error rate (FER) data from recovered information. The controller 514 is also coupled to the receiver front-end circuitry 506 and the signal processing module 508 (generally realised by a digital signal processor (DSP)). The controller 514 is also coupled to a memory device 516 that selectively stores operating regimes, such as decoding/encoding functions, synchronisation patterns, code sequences, RSSI data, and the like. A timer 518 is operably coupled to the controller 514 to control the timing of operations (transmission or reception of time-dependent signals) within the RF communication unit 500.

As regards the transmit chain, this essentially includes an input device 520, such as a keypad, coupled in series through transmitter/modulation circuitry 522 and a power amplifier 524 to the antenna 502. The transmitter/modulation circuitry also includes a mixer circuit that may benefit from the examples herein described, which up-converts a baseband transmit signal to a radio frequency signal for amplifying by power amplifier 524 and radiating from antenna 502. The signal processor module 508 in the transmit chain may be implemented as distinct from the processor in the receive chain. Alternatively, a single processor module 508 may be used to implement processing of both transmit and receive signals, as shown in FIG. 5. Clearly, the various components within the RF communication unit 500 can be realised in discrete or integrated component form, with an ultimate structure therefore being merely an application-specific or design selection.

Figure 6:
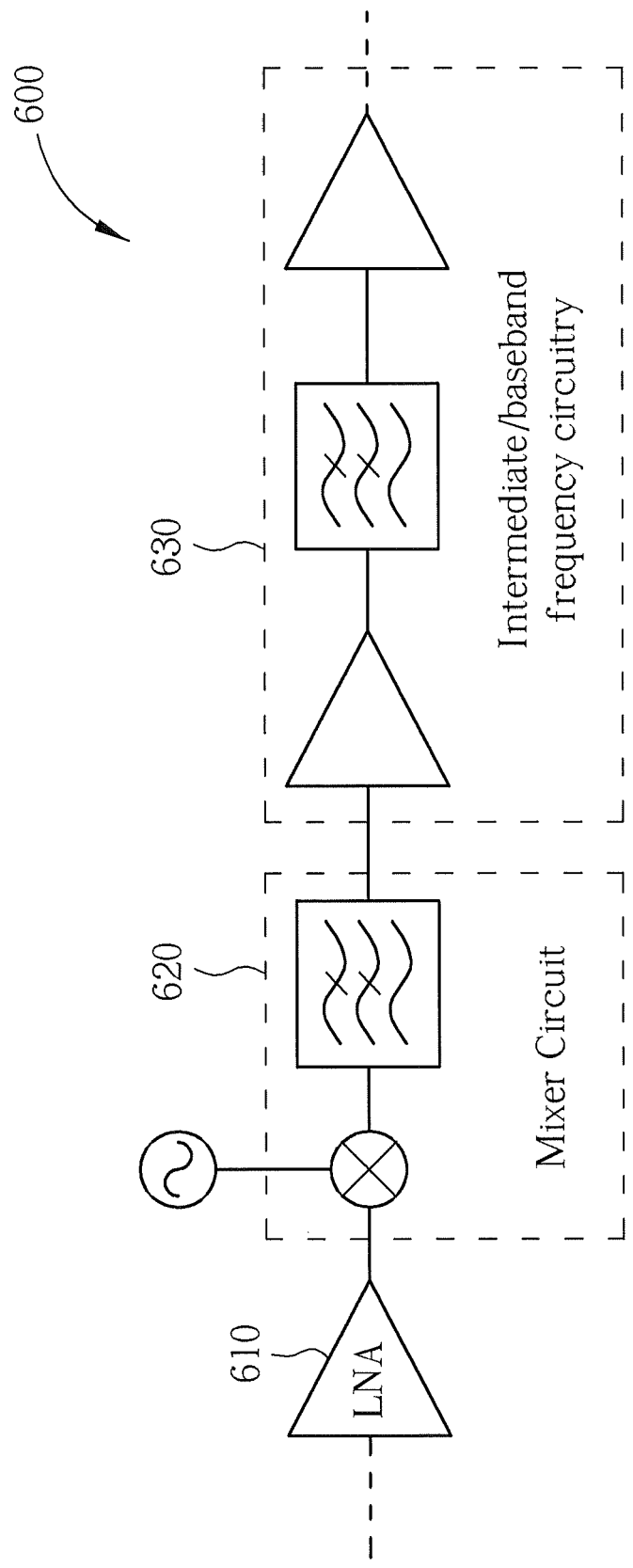
FIG. 6 illustrates an example of generic front-end receiver circuitry.

Referring now to FIG. 6, there is illustrated an example of generic front-end receiver circuitry 600, such as may be used to implement broadband front-end circuitry 506 of the RF communication unit 500 of FIG. 5. The front-end circuitry 600 comprises low noise amplifier (LNA) 610 for amplifying a received RF signal, for example as would be received by antenna 502 of RF communication unit 500. The front-end circuitry 600 further comprises mixer circuit 620 arranged to perform frequency translation of the amplified signal output by LNA 610 to a lower intermediate or baseband frequency signal. The intermediate/baseband frequency signal output from mixer circuit 620 is then baseband amplified and further filtered, etc. by intermediate/baseband frequency circuitry 630.

Figure 7:
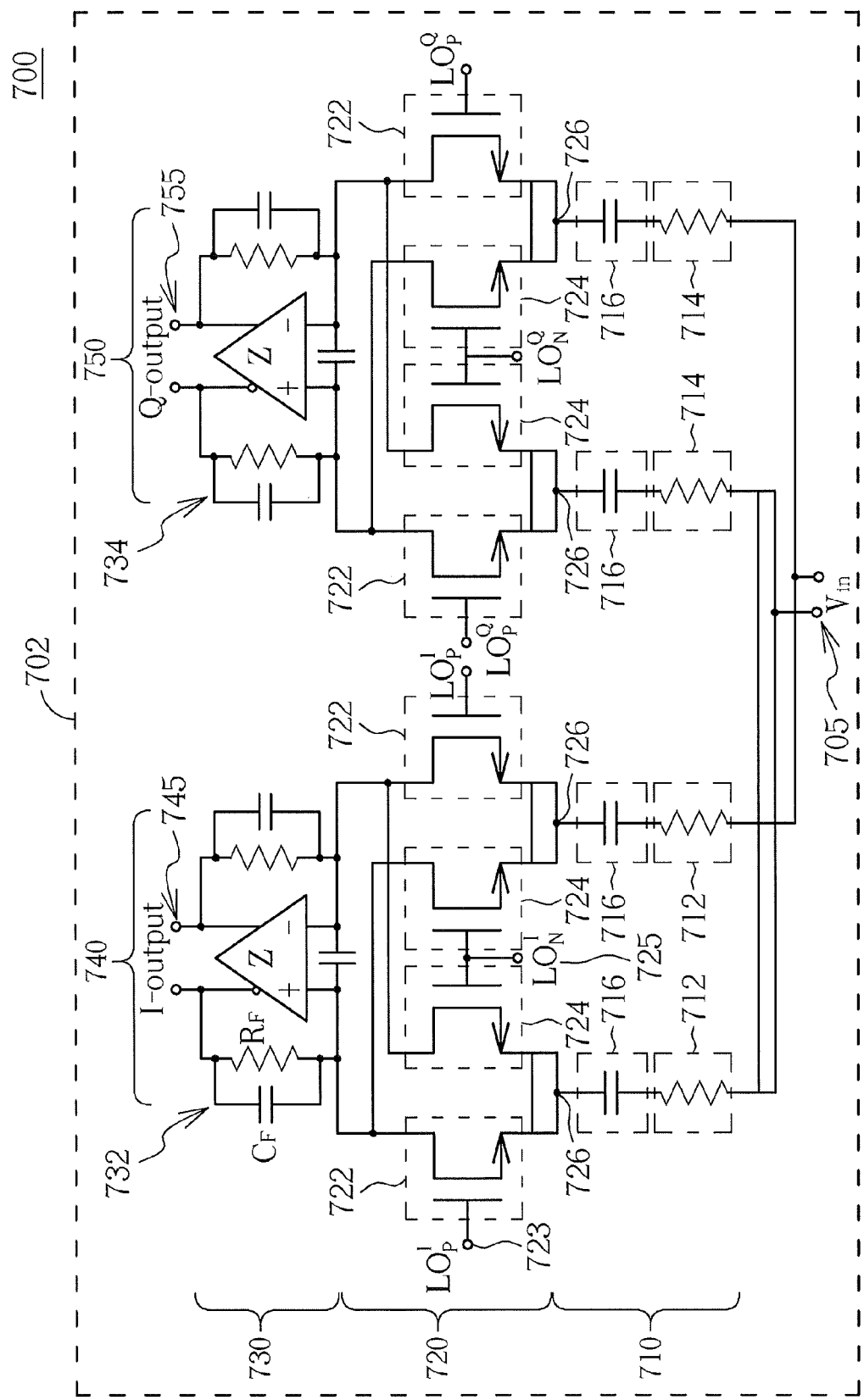
FIG. 7 illustrates an example of a simplified diagram of a mixer circuit according to some embodiments of the invention.

Referring now to FIG. 7, there is illustrated an example of a simplified diagram of mixer circuit 700 for translating an input frequency of a received signal to an output frequency, such as may be used to implement the mixer circuit 620 of FIG. 6. For example, in the case of a mixer used within an RF receiver front end, the mixer circuit 700 may be arranged to translate an RF frequency of a received signal to an intermediate or baseband frequency. For the illustrated example, the mixer circuit 702 is provided within an integrated circuit device 702.

The mixer circuit 700 comprises an input stage 710 arranged to convert an input voltage signal received at an input 705 of the mixer circuit into at least one current signal, and a frequency conversion stage 720 arranged to convert a signal component of the at least one current signal from an input frequency to an output frequency. For the example illustrated in FIG. 7, the input stage 710 is arranged to receive a differential input voltage signal at the input 705 of the mixer circuit, and to convert the received differential input voltage signal into at least one differential current signal. Furthermore, the mixer circuit 700 of FIG. 7 is arranged to output an in-phase (I) signal component 745 and a quadrature (Q) signal component 755. Accordingly, the frequency conversion stage comprises a first frequency conversion circuit located within an in-phase (I) channel 740 of the mixer circuit 700 and a second frequency conversion circuit located within a quadrature (Q) channel 750 of the mixer circuit 700. It will be appreciated that the invention is not limited to a differential mixer implementation, but may equally be applied to a single balanced mixer implementation. Furthermore, the invention is not limited to being implemented within a complex (I/Q) mixer arrangement.

Each of the frequency conversion circuits comprises two pairs of cross-coupled switching elements 722, 724. More specifically, each frequency conversion circuit of the mixer circuit illustrated in FIG. 7 comprises a Gilbert cell mixer circuit. Furthermore, the input stage 710 illustrated in FIG. 7 is arranged to convert the received differential input voltage signal into a first, in-phase (I) differential current signal and a second, quadrature (Q) differential current signal. Accordingly, each frequency conversion circuit is arranged to receive the corresponding differential current signal from the input stage 710, and to convert a signal component of the at least one differential current signal from the input frequency, for example an RF frequency, to an output frequency, for example a baseband or intermediate frequency. Each frequency conversion circuit converts the respective current signal from the input frequency to the output frequency by way of the received current signal being chopped by the switching elements 722, 724 in accordance with a switching signal. For the illustrated example, the switching signal is provided by opposing local oscillator (LO) signals 723, 725 (e.g. LO signals that are 180 degrees out of phase with each other) that are provided to gate terminals of the switching elements 722, 724 respectively.

In this example, the input stage 710 comprises at least one resistance connected between the input 705 of the mixer circuit and at least one switching element of the frequency conversion stage 720. For the example illustrated in FIG. 7, the input stage comprises a first pair of resistances 712, each connected between the input 705 of the mixer circuit and a pair of cross-coupled switching elements 722, 724 within the frequency conversion circuit of the in-phase (I) channel 740, and a second pair of resistances 714, each connected between the input 705 of the mixer circuit and a pair of cross-coupled switching elements 722, 724 within the frequency conversion circuit of the quadrature (Q) channel 750. In this manner, the first pair of resistances 712 is arranged to provide a first differential current signal to the frequency conversion circuit of the in-phase (I) channel 740, whilst the second pair of resistances 714 is arranged to provide a second differential current signal to the frequency conversion circuit of the quadrature (Q) channel 750.

The switching elements of the frequency conversion stage 720 (which for the example illustrated in FIG. 7 comprise two pairs of cross-coupled switching elements 722, 724 within the frequency conversion circuit of the in-phase (I) channel 740 and two pairs of cross-coupled switching elements 722, 724 within the frequency conversion circuit of the quadrature (Q) channel 750) and the resistances 712, 714 of the input stage 710 are arranged such that the switching elements 722, 724 of the frequency conversion stage comprise a 'turn-on' resistance (i.e. a resistance when the switching element is turned/switched 'ON' and current is able to flow there through) that exhibits a resistivity that is at least a factor less than the respective input resistances 712, 714 connected thereto.

To first order approximation the 'turn-on' resistance ($R_{ON}$) of the mixer core switches of a mixer implemented with MOSFETs can be expressed as $$R_{ON} \cong \frac{1}{K'\frac{W}{L}(V_{gs} - V_t)},$$

where W is the effective transistor channel width, L is the effective channel length, K' is the transconductance parameter, $V_{gs}$ is the gate-source voltage applied to the transistor and $V_t$ is the threshold voltage. Ideally the ratio α of the value of this resistance ($R_{ON}$) to the value of the input resistance ($R_1$) should tend to zero (in mathematical terms), with $R_1$ having the desired finite value. This ideal situation is not practically attainable due to parasitic effects associated with real transistors. In fact, in practical implementations with current state-of-the-art technologies the ratio α is limited to values of circa 1/5 to 1/10. Smaller values will result in such strong parasitic effects that the noise performance of the mixer will begin to degrade with only a very modest further improvement in linearity. However, in order to achieve the desired effect (described in more detail below), it is contemplated that the switching elements 722, 724 of the frequency conversion stage comprise a 'turn-on' resistance that exhibits a resistivity that is at least half that of the respective input resistance 712, 714 connected thereto.

The optimal value of the ratio α depends on the system constraints and the relative importance of noise vs. linearity. Thus, the optimal value for a particular circuit would need to be found by experimentation and/or simulation. It is likely that, for the same application, the optimal value will become smaller with future technology improvements.

If the condition of the 'turn-on' resistance ($R_{ON}$) for the frequency conversion stage switching elements 722, 724 is significantly smaller (for example exhibiting a resistivity value that is a factor less) than the input stage resistance ($R_1$) than the nodes of the switching elements to which the resistances are connected, which for the illustrated example comprise drain nodes 726 of the cross-coupled switching element pairs 722, 724, can be considered virtual grounds. As a result, the conversion of the voltage signal received at the input 705 into a current signal by the resistances 712, 714 is highly linear. In this manner, the distortion typically introduced by the transconductance input stages of the prior art circuits is substantially eliminated.

In addition, the resistances 712, 714 may also be used to set the input impedance of the mixer circuit 700 to a well defined value. In this manner, in the case where the mixer circuit 700 comprises a sub-block of a larger, integrated on-chip system, such as the receiver front-end circuitry 600 of FIG. 6, this ability to set a well defined input impedance of the mixer circuit 700 may be exploited to define the load impedance of a preceding sub-block, for example the LNA 610 of the receiver front-end circuitry of FIG. 6.

A further benefit of this mixer configuration is the fact that if the feedback resistors of the transimpedance amplifier are implemented with the same type of resistors (e.g. non-silicided P+ polysilicon resistors) used to implement the input stage, then, to first order approximation, the gain of the mixer can be determined by the ratio of two resistors of the same type. This makes the gain a well controlled parameter with small variations between different parts.

Significantly, the mixer circuit of at least one of the examples enables the implementation of an inductor-less mixer circuit with good linear characteristics, as well as low and well defined impedances at the interfaces with adjacent circuits, such as a preceding LNA circuit. As a result, the integration of such a mixer circuit into an integrated circuit device as part of a larger on-chip system, such as an integrated on-chip RF receiver front-end, may be achieved without inductors and the like impacting on the scalability of the system. Furthermore, the fact that no active input transconductance stage is required in some examples means that the power usually dissipated within the transconductance stage of prior art mixer circuits may be reallocated to other sub-blocks within the system, such as a preceding LNA or a baseband transimpedance amplifier in the case of a RF receiver front-end system. Accordingly, smaller lower power integrated systems circuits comprising such mixer circuits are achievable.

For the illustrated example, the switching elements 722, 724 of the frequency conversion stage 720 comprise MOSFETs (metal oxide field effect transistors), which suffer from significant flicker noise. Accordingly, the mixer circuit 700 of FIG. 7 further comprises coupling capacitors 716, which suppress the DC current flowing in the MOSFETs 722, 724 of the frequency conversion circuits. Since the flicker noise of MOSFETs is proportional to the drain bias current flowing in the transistor, the suppression of the DC current flowing there through also reduces the flicker noise caused by the MOSFETs 722, 724. The resistances 712, 714 further act to isolate the in-phase (I) channel 740 and the quadrature (Q) channel 750 of the mixer circuit 700 in such a manner that transimpedance amplifier noise is not significantly amplified.

A further benefit of the coupling capacitances 716 is that they enable greater flexibility in setting the common-mode voltage of the mixer transimpedance amplifiers. The latter can in fact be set independently from the output DC bias voltage of a preceding system sub-block such as, for example, an LNA circuit. In essence, the two plates of each capacitor 716 can have arbitrary DC bias voltages.

Output ports of the mixer circuit are terminated by transimpedance amplifiers 732, 734, which are used to hold the source/drain potential of the switching transistors at a known potential and also function as low-pass filters.

Figure 8:
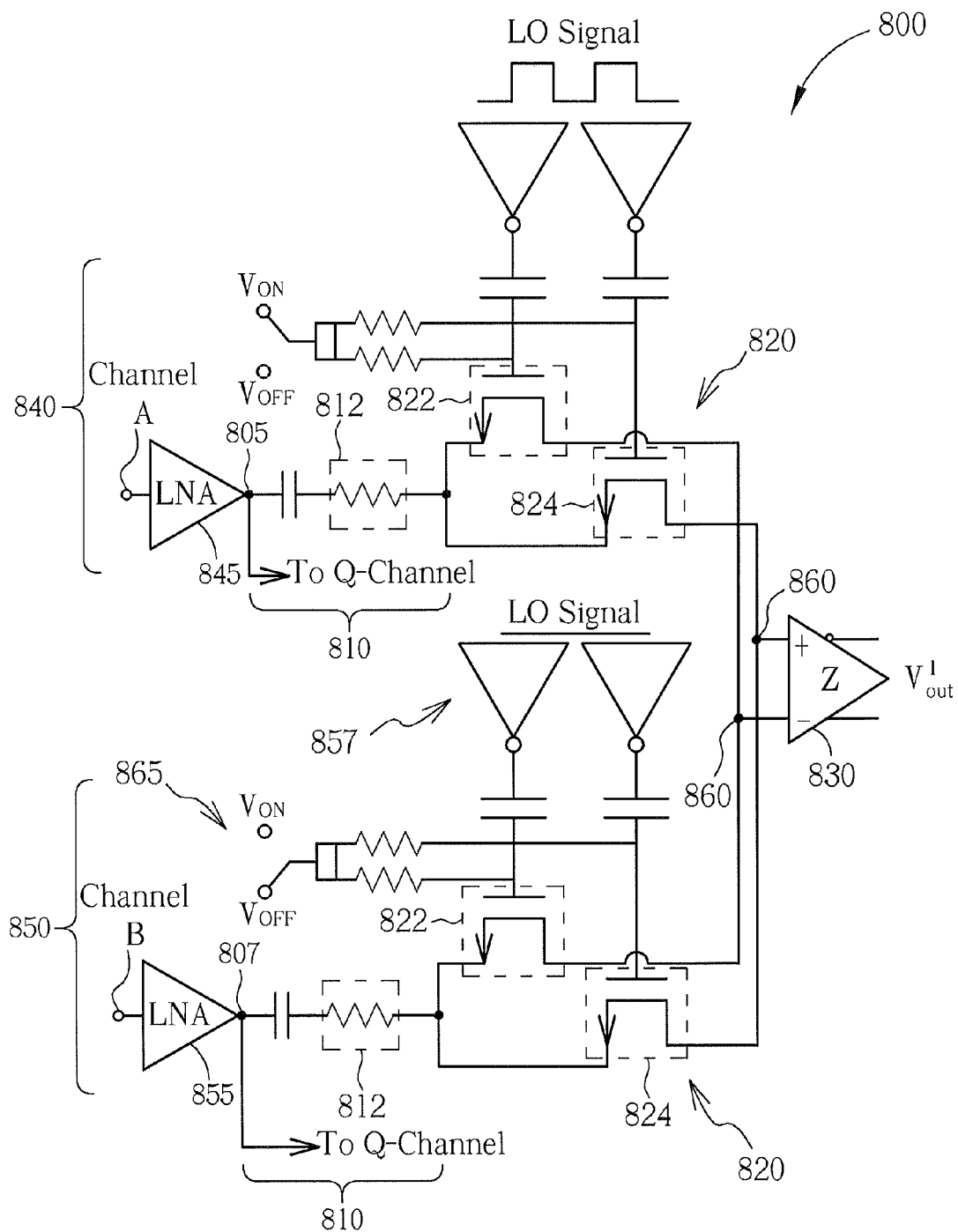
FIG. 8 illustrates an example of a mixer circuit according to some alternative embodiments of the invention.

Referring now to FIG. 8, there is illustrated an example of a mixer circuit 800 according to some alternative examples. From FIG. 7, and bearing in mind that the 'turn-on' resistance of the switching elements 722, 724 is significantly smaller (for example exhibiting a resistivity value that is a factor less) than the respective resistances 712, 714 connected thereto, the proposed mixer configuration of FIG. 8 comprises similarities with a standard inverting operational amplifier (op-amp)-based amplifier circuit, the main difference being the frequency translation performed by the switching elements 822, 824. This feature of the proposed mixer configuration enables the sharing of a transimpedance stage 830 at the outputs of multiple frequency conversion stages 820, as illustrated in FIG. 8, thereby enabling the recombining of multiple input channels. At the intermediate or baseband frequency the transimpedance amplifier virtual ground acts as a current summing junction, where the signals (in the form of currents) of all of the channels are summed together. Due to the fact that all but the single active channel will have a zero signal current, the summing junction is effectively used as a multiplexer.

The traditional technique of sharing sub-blocks in multi-channel receivers is to recombine the outputs of all the LNAs to the input of a single mixer, for example as may be used in a cellular base station or Node B. In this manner, all sub-blocks within a receive chain, from and including the mixer, can be shared between all receive channels. However, a drawback of this approach is that, for an integrated receiver circuit whereby the plurality of LNAs and the single mixer are integrated within a single integrated circuit device, each LNA is required to be placed in close proximity to the input pads of the integrated circuit device in order to reduce noise as much as possible. In receivers with a large number of receive channels, physical constraints mean that it is not possible for all LNAs to be located close to the mixer. As a result, the outputs of at least some of the LNAs are required to be routed over a long distance, thereby causing a significant capacitive load to those LNA outputs, making the use of inductor-less design techniques very difficult.

For the example illustrated in FIG. 8, the mixer circuit 800 comprises two input signal channels 840, 850, each channel comprises an input 805, 807 for receiving an input voltage signal from an LNA 845, 855. Each signal channel 840, 850 of the mixer circuit 800 comprises an input stage 810, connected between the respective input 805, 807 of the mixer circuit 800 and a frequency conversion stage 820. The input stage 810 of each channel comprises at least one resistance 812 connected between the respective input 805, 807 and a pair of cross-coupled switching elements 822, 824 of the corresponding frequency conversion stage 820. Rather than recombining the different channels at the outputs of the LNAs, the different channels are recombined at a transimpedance virtual ground 860, at the output of frequency conversion stages 820. Here, the switching elements 822 and 824 of the frequency conversion stages 820 also function as de-multiplexer switches. In order to achieve this, for all but the active channel, the gate bias voltage of the switching transistors 822, 824 is grounded so that the inactive LNAs are essentially isolated from the rest of the receiver. Thus, for the illustrated example, when a first Channel A 840 is the active channel, for all other channels (which for the illustrated example comprises a second Channel B 850) the gate bias voltage of the switching transistors is grounded, by way of a switch 865. The local oscillator signal 857 for the second Channel B 850 is also halted.

An advantage provided by the arrangement of FIG. 8 is that the physical interconnection between each LNA and its respective mixer circuit may be kept short, thereby ensuring that any parasitic capacitances have a very small value, and thereby reduced risk of noise pick-up. As a result, such an arrangement is significantly more conducive to an inductor-less receiver design than the conventional method of recombining the channels. By recombining the channels at the transimpedance virtual ground at the output of frequency conversion stages 820, the signals being recombined comprise the lower intermediate or baseband frequency. As such, these signals can be routed over longer distances with less risk of performance degradation.

One potential disadvantage of this approach of recombining multiple channels is that each channel requires its own input and frequency conversion stages 810, 820. In practical designs, to avoid large quadrature errors, the local oscillator frequency dividers may need to be replicated as well. However, in such integrated circuit designs, this is a small penalty as compared to the benefits of an inductor-less arrangement.

For simplicity, single ended LNAs and single balanced mixers are illustrated. However, the arrangement of FIG. 8 is equally applicable to fully differential designs. Furthermore, whilst the mixer circuit of FIG. 8 has been illustrated as being arranged to perform frequency conversion for two channels, it will be appreciated that the mixer circuit may be adapted to perform frequency conversion for more than two channels.

Figure 9:
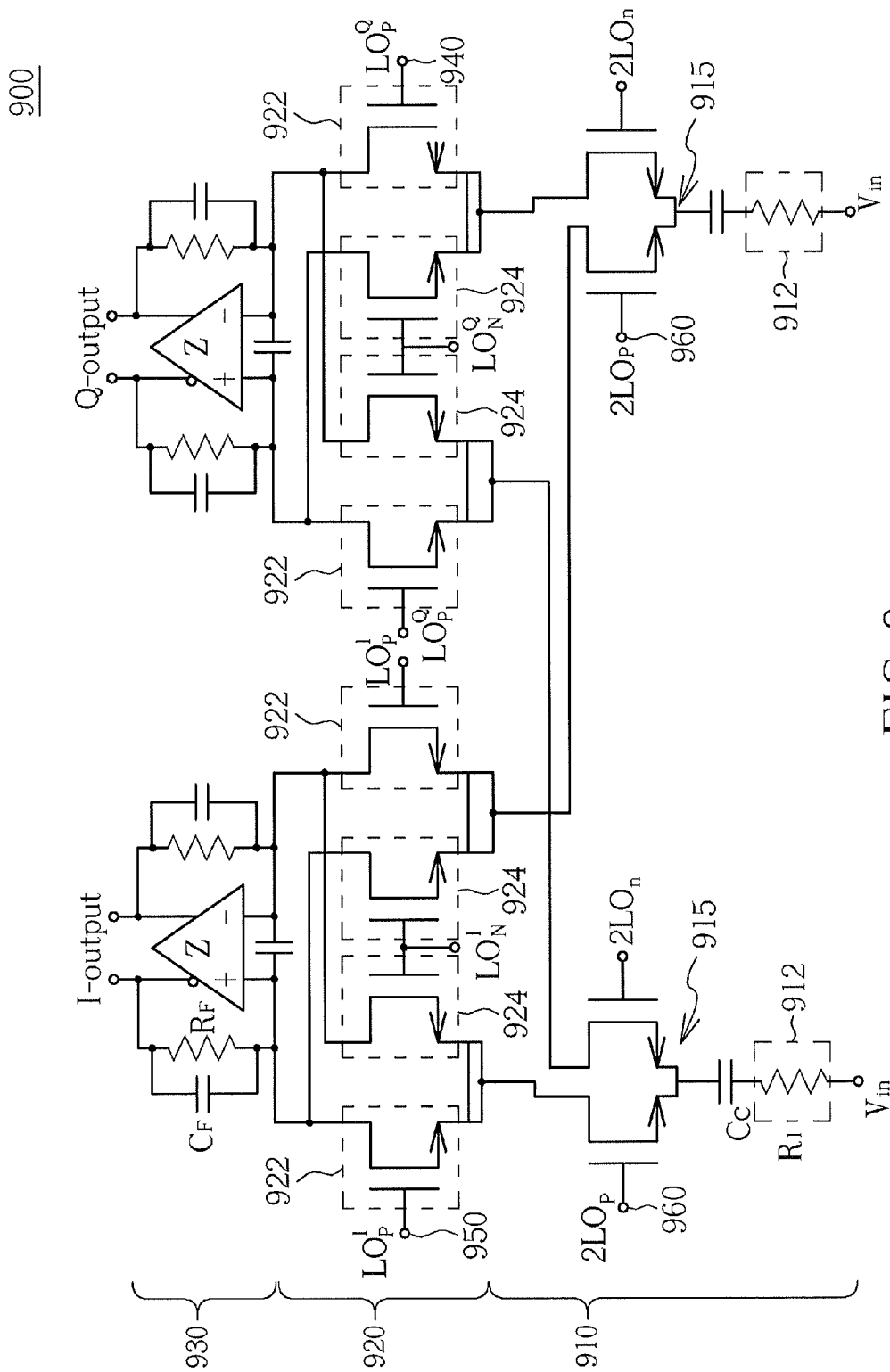
FIG. 9 illustrates an example of a mixer circuit according to some further embodiments of the invention.
Figure 10:
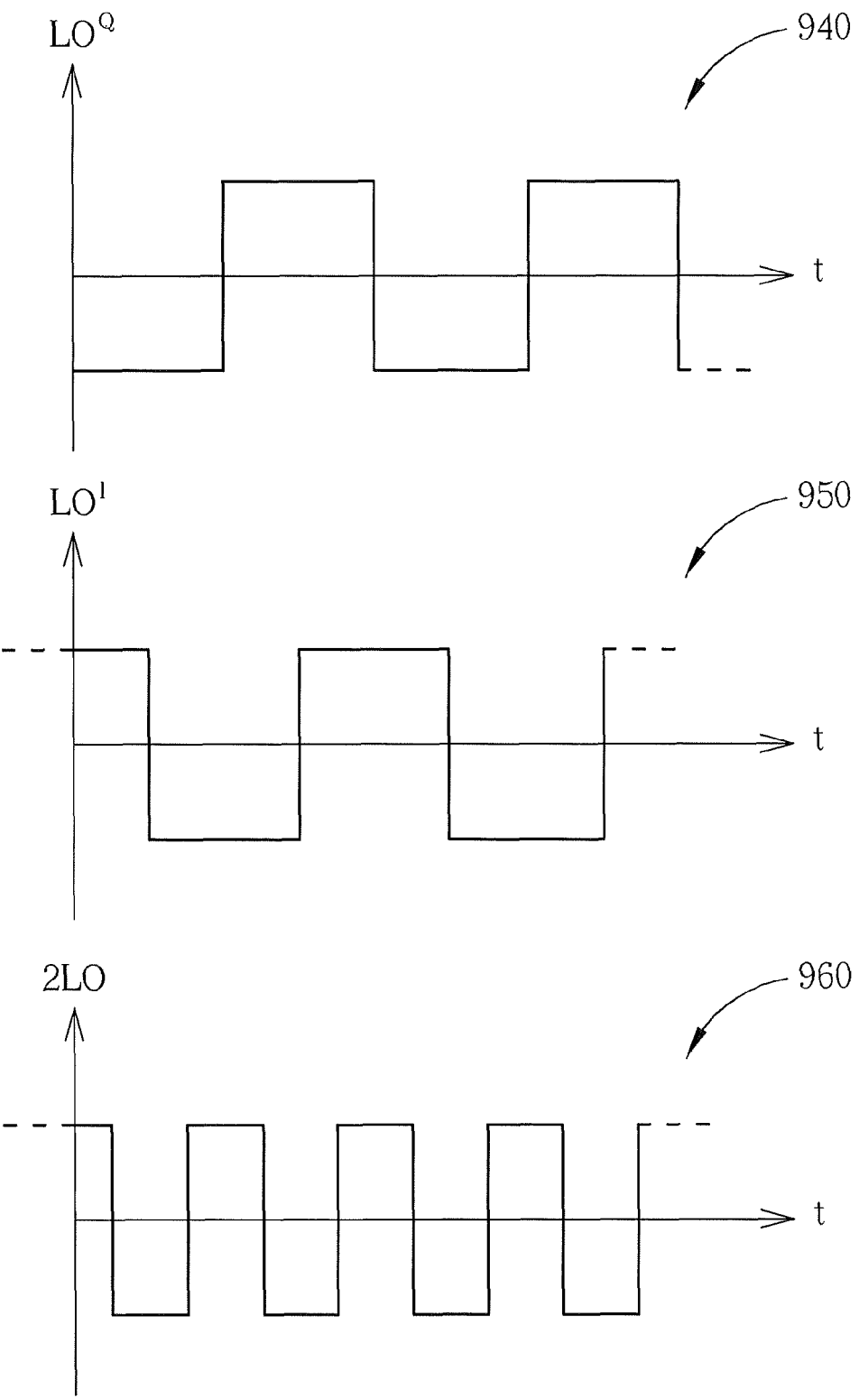
FIG. 10 illustrates an example of switching control signals according to some embodiments of the invention.

Referring now to FIG. 9, there is illustrated an example of a further alternative mixer circuit 900. For the mixer circuit 900 illustrated in FIG. 9, the input stage 910 comprises intermediate switching elements 915 connected between input resistances 912 of the input stage 910 and the switching elements 922, 924 of the frequency conversion stage 920. The intermediate switching elements 915 of the input stage 910 are arranged to toggle at twice the frequency of the switching element 922, 924. Examples of the switching control signals $LO^Q$ 940, $LO^I$ 950, and the 2LO 960 for the switching elements 922, 924 of the frequency conversion stage 920 and the intermediate switching elements 915 respectively are illustrated in FIG. 10. In this manner, the flicker noise of the frequency conversion stage switching elements 922, 924 does not appear at the output of, the mixer circuit. This is achieved because, when the $LO^I$ signal 950 changes polarity, the switching elements 924 of the I channel do not carry any current. All of the current is in fact steered to the Q path with the help of the intermediate switching elements 915. Similarly, when the $LO^Q$ signal 940 changes polarity, the Q channel switching elements 924 do not conduct any signal and all of the current is steered to the I channel with the help of the intermediate switching elements 915. Since switching elements 924 only contribute noise to the output during their switching transients when all of them conduct some current, the addition of intermediate switching elements 915 suppresses the noise generated by the former transistors.

Conversely, whilst the flicker noise of the intermediate switching elements 915 does appear at the output of the mixer circuit 900, it appears as a common-mode noise, and can therefore be suppressed. The 1/f noise appears as a common mode signal at output of the transimpedance amplifiers because the noise of each transistor 915 is steered for an equal amount of time to the positive as to the negative output node of the amplifier. Since the LO signal frequency is orders of magnitude faster than the frequencies at which flicker noise signal changes, the noise signal present on the positive amplifier output node can, for every practical purpose, be considered to be the same as the one on the negative node. This common-mode noise can then be easily suppressed with the help of intermediate-/baseband-filters with a good common-mode rejection. For example, op-amp based filters only pass differential mode signals. Common mode signals are significantly attenuated.

A further advantage provided by the arrangement of FIG. 9 is that only a single pair of resistances 912 is required within the input stage 910 for providing the current signal for both the in-phase (I) and quadrature (Q) channels of the mixer circuit 900. Isolation between the 'I' and 'Q' channels is provided by the intermediate devices 915. Sharing of the input stage resistors between the two channels can result in improved quadrature amplitude matching between the 'I' and the 'Q' channels compared to an implementation where independent resistors are used for the two channels.

Whilst a differential mixer circuit has been illustrated in FIG. 9, it will be appreciated that this example may equally be implemented within a single balanced mixer circuit.

For the various examples hereinbefore described, not only will the frequency conversion stages 720, 820, 920 convert signal components at a specifically intended input frequency to the desired baseband or intermediate frequency, but they will also convert any signal components at frequencies close to odd harmonics of the intended input frequency to the desired baseband or intermediate frequency. This is due to the fact that the current signal provided by the input stage of the mixer circuit is chopped by the switching elements of the frequency conversion stage with a waveform that can be mathematically described by a square wave of amplitude '1' and period $T=1/f_{LO}$ ($f_{LO}$ being the local oscillator frequency of the waveform with which the input current is chopped). The Fourier series expansion of such a function includes all of the odd harmonics of the fundamental frequency $f_{LO}$. In a receiver, every such harmonic creates a so-called 'spurious response'. These spurious responses have to be suppressed as much as possible as an interfering signal, at such a spurious frequency may prevent reception of the wanted signal. This is traditionally implemented with the help of filters. However, in an inductor-less circuit, such as any of the mixer circuits hereinbefore described, it is not possible to implement a sufficiently selective filter, 'on-chip' between, for example, the LNA and the mixer circuit without the use of inductors.

Figure 11:
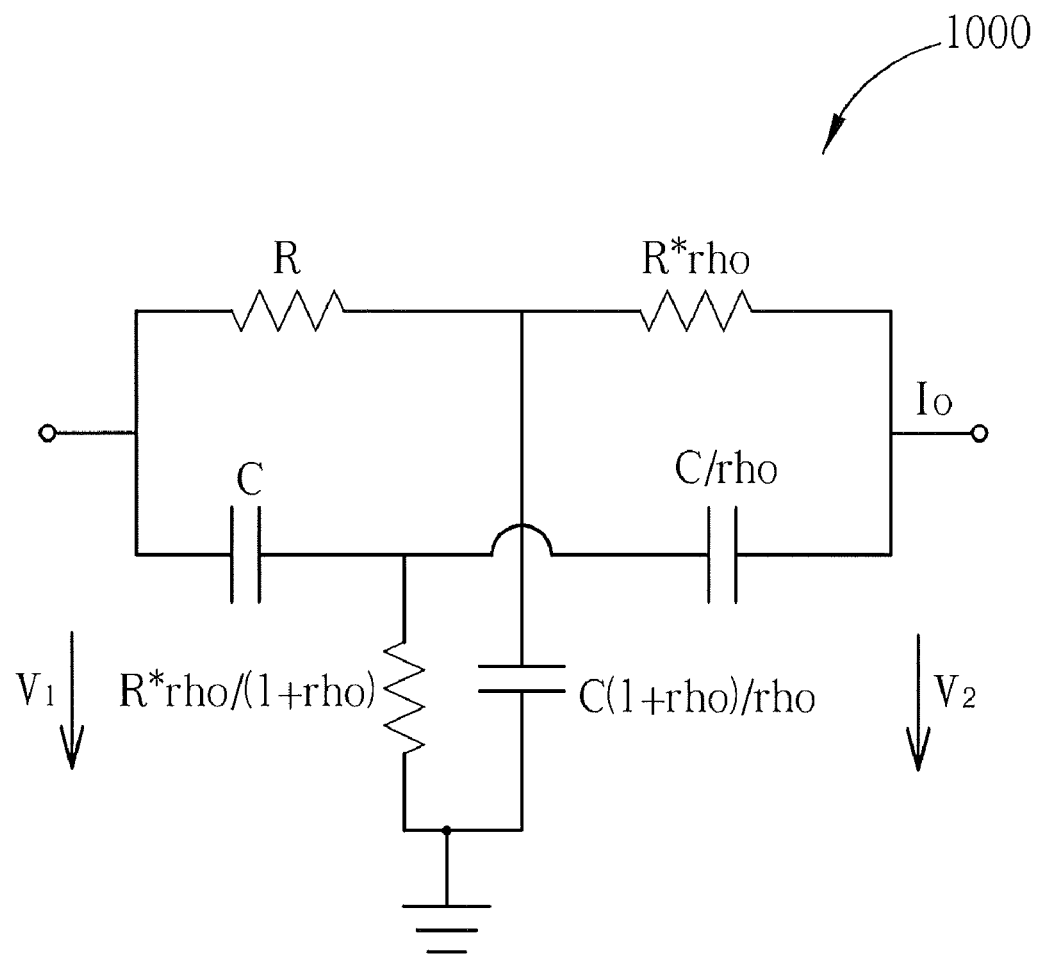
FIG. 11 illustrates an example of an implementation of an input stage RC current filter according to some embodiments of the invention.

In accordance with some examples, each input stage resistance of the mixer circuit may be arranged to provide a transmission null/'zero' at one or more of the odd harmonic frequencies for the toggling frequency of the frequency conversion stage switching elements. For example, referring to FIG. 11, there is illustrated an example of an implementation of an input stage, such as may be used to implement one of the resistances 712, 714, 812, 912 of the mixer circuits of FIGS. 7, 8 and/or 9. The input stage comprises a passive RC (resistance/capacitance) network 1000 arranged to provide a transmission null/zero at an odd harmonic of the switching frequency of the frequency conversion stage switching elements, and to comprise a low-frequency characteristic that converges towards the required resistance ($R_1$). In this manner, unwanted signal components within the received input signal located at the odd harmonic of the switching frequency will be substantially blocked by the transmission null/zero.

For the illustrated example, the RC network 1000 comprises a Twin-T RC filter network circuit, where $R*(1+rho)=R_1$. In the case of a differential mixer, the Twin-T ground connections may be replaced by 'symmetry plane' ground connections. It is further contemplated that each input stage may comprise a plurality of cascaded Twin-T network circuits, or other RC networks, arranged to provide transmission nulls/zeros at a plurality of odd harmonics of the switching frequency of the frequency conversion stage switching elements (722, 724, 822, 824, 922, 924).

It is envisaged that the examples are not limited to use within an RF communication unit receiver, and may equally be applied to any circuit application requiring a mixer circuit. For example a mixer circuit adapted in accordance with the present invention may be implemented within offset-PLLs, multi-loop-PLLs, Costas loops, etc. Furthermore, a skilled artisan will appreciate that in other applications, alternative functions/circuits/devices and/or other techniques may be used to implement the inventive concept.

Thus, the hereinbefore examples provide mixer circuits that enable the implementation of an inductor-less mixer circuit with good linear characteristics, as well as low and well defined impedances at the interfaces with adjacent circuits, such as a preceding LNA circuit, etc. As a result, the integration of such a mixer circuit into an integrated circuit device, for example as part of a larger on-chip system, such as an integrated on-chip RF receiver front-end, may be achieved without inductors and the like, therefore allowing scalability of the system. Furthermore, the fact that no active input transconductance stage is required, in some examples, means that the power usually dissipated within the transconductance stage of prior art mixer circuits may be reallocated to other sub-blocks within the system, such as a preceding LNA or a baseband transimpedance amplifier in the case of a RF receiver front-end system. Accordingly, smaller lower power integrated systems/circuits comprising such mixer circuits are achievable.

It is envisaged that the aforementioned examples may be applied by a manufacturer to any integrated circuit comprising mixer circuit, for example those of the MediaTek™ wireless handset and/or wireless connectivity family of products. It is further envisaged that, for example, a semiconductor manufacturer may employ the examples in a design of a stand-alone device, such as an integrated front-end circuit, or application-specific integrated circuit (ASIC) and/or any other sub-system element.

It will be appreciated that, for clarity purposes, the above examples have described embodiments of the invention with reference to certain functional units or devices or circuits. However, it will be apparent that any suitable distribution of functionality between different functional units or devices or circuits, for example with respect to the transconductance circuitry, may be used without detracting from the invention. Hence, references to specific functional units are only to be viewed as references to suitable means for providing the described functionality, rather than indicative of a strict logical or physical structure or organization.

Aspects of the invention may be implemented in any suitable form, and as such the elements and components of an embodiment of the invention may be physically, functionally and logically implemented in any suitable way. Indeed, the functionality may be implemented in a single unit, in a plurality of units or as part of other functional units.

Although the invention has been described in connection with some embodiments, it is not intended to be limited to the specific form set forth herein. Rather, the scope of the invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or component. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed. In addition, singular references do not exclude a plurality. Thus, references to 'a', 'an', 'first', 'second', etc. do not preclude a plurality.

Thus, an improved mixer circuit has been described, wherein at least one or more of the aforementioned disadvantages with prior art arrangements has been substantially alleviated.

The invention claimed is:

1. A mixer circuit comprising:
    an input stage arranged to convert an input voltage signal received at an input of the mixer circuit into at least one current signal; and
    a frequency conversion stage comprising at least one switching element arranged to convert a signal component of the at least one current signal from an input frequency to an output frequency;
    wherein the input stage comprises at least one resistance connected between the input of the mixer circuit and the at least one switching element and the at least one switching element and the at least one resistance are arranged such that the at least one switching element comprises a 'turn-on' resistance that exhibits a resistivity that is a factor less than the at least one resistance connected thereto.

2. The mixer circuit of claim 1 wherein the input stage is arranged to receive a differential input voltage signal at the input of the mixer circuit and to convert the received differential input voltage signal into at least one differential current signal.

3. The mixer circuit of claim 2 wherein the frequency conversion stage comprises at least one frequency conversion circuit comprising two pairs of cross-coupled switching elements, said at least one frequency conversion circuit being arranged to receive the at least one differential current signal from the input stage and to convert a signal component of the at least one differential current signal from the input frequency to an output frequency.

4. The mixer circuit of claim 3 wherein the frequency conversion stage comprises at least one Gilbert cell mixer circuit.

5. The mixer circuit of claim 3 wherein the frequency conversion stage comprises an in-phase frequency conversion circuit and a quadrature frequency conversion circuit.

6. The mixer circuit of claim 5 wherein the input stage is arranged to receive a differential input voltage signal at the input of the mixer circuit and to convert the received differential input voltage signal into a first differential current signal for the in-phase frequency conversion circuit and a second differential current signal for the quadrature frequency conversion circuit.

7. The mixer circuit of claim 1 wherein the at least one resistance of the input stage comprises resistance-capacitance network arranged to provide a transmission zero at an odd harmonic of a switching frequency of the frequency conversion stage switching elements.

8. The mixer circuit of claim 7 wherein the resistance-capacitance network comprises a Twin-T resistance-capacitance filter circuit.

9. The mixer circuit of claim 1 wherein the at least one resistance of the input stage comprises a plurality of cascaded resistance-capacitance networks arranged to provide transmission zeros at a plurality of odd harmonics of a switching frequency of the switching elements of the frequency conversion stage.

10. The mixer circuit of claim 1 wherein the input stage further comprises at least one coupling capacitance connected in series with the at least one resistance.

11. The mixer circuit of claim 1 wherein the input stage comprises at least one intermediate switching element connected between the at least one resistance of the input stage and the at least one switching element of the frequency conversion stage, the at least one intermediate switching element being arranged to toggle at a frequency at least twice that of the at least one switching element of the frequency conversion stage.

12. An integrated circuit device comprising a mixer circuit comprising an input stage arranged to convert an input voltage signal received at an input of the mixer circuit into at least one current signal, and a frequency conversion stage comprising at least one switching element arranged to convert a signal component of the at least one current signal from an input frequency to an output frequency;
wherein the input stage comprises at least one resistance connected between the input of the mixer circuit and the at least one switching element and wherein
the at least one switching element and the at least one resistance are arranged such that the at least one switching element comprises a 'turn-on' resistance that exhibits a resistivity that is a factor less than the at least one resistance connected thereto.

13. The integrated circuit device of claim 12 wherein the input stage is arranged to receive a differential input voltage signal at the input of the mixer circuit and to convert the received differential input voltage signal into at least one differential current signal.

14. The integrated circuit device of claim 13 wherein the frequency conversion stage comprises at least one frequency conversion circuit comprising two pairs of cross-coupled switching elements, said at least one frequency conversion circuit being arranged to receive the at least one differential current signal from the input stage and to convert a signal component of the at least one differential current signal from the input frequency to an output frequency.

15. The integrated circuit device of claim 12 wherein the at least one resistance of the input stage comprises resistance-capacitance network arranged to provide a transmission zero at an odd harmonic of a switching frequency of the frequency conversion stage switching elements.

16. The integrated circuit device of claim 12 wherein the input stage further comprises at least one coupling capacitance connected in series with the at least one resistance.

17. A radio frequency communication unit comprising a mixer circuit comprising an input stage arranged to convert an input voltage signal received at an input of the mixer circuit into at least one current signal, and a frequency conversion stage comprising at least one switching element arranged to convert a signal component of the at least one current signal from an input frequency to an output frequency;
wherein the input stage comprises at least one resistance connected between the input of the mixer circuit and the at least one switching element and wherein
the at least one switching element and the at least one resistance are arranged such that the at least one switching element comprises a 'turn-on' resistance that exhibits a resistivity that is a factor less than the at least one resistance connected thereto.

18. The radio frequency communication unit of claim 17 wherein the input stage is arranged to receive a differential input voltage signal at the input of the mixer circuit and to convert the received differential input voltage signal into at least one differential current signal.

19. The radio frequency communication unit of claim 17 wherein the at least one resistance of the input stage comprises resistance-capacitance network arranged to provide a transmission zero at an odd harmonic of a switching frequency of the frequency conversion stage switching elements.

20. The radio frequency communication unit of claim 17 wherein the input stage further comprises at least one coupling capacitance connected in series with the at least one resistance.

* * * * *